United States Patent [19]

Gutman et al.

[11] Patent Number: 5,508,107

[45] Date of Patent: Apr. 16, 1996

[54] PRESSURE-SENSITIVE ADHESIVE TAPES FOR ELECTRONICS APPLICATIONS

[75] Inventors: Gustav Gutman; Steven D. Yau, both of Austin, Tex.

[73] Assignee: Minnesota Mining and Manufacturing Company, St. Paul, Minn.

[21] Appl. No.: 365,748

[22] Filed: Dec. 29, 1994

Related U.S. Application Data

[63] Continuation-in-part of Ser. No. 98,166, Jul. 28, 1993, Pat. No. 5,378,405.

[51] Int. Cl.$^6$ ............................... B32B 33/00; C09J 7/02
[52] U.S. Cl. ........................... 428/339; 83/906; 428/356
[58] Field of Search ..................... 428/339, 356

[56] References Cited

U.S. PATENT DOCUMENTS

| | | |
|---|---|---|
| 3,104,985 | 9/1963 | Williams et al. . |
| 3,497,383 | 2/1970 | Olyphant et al. . |
| 3,691,140 | 9/1972 | Silver . |
| 4,098,945 | 7/1978 | Oehmke ................................. 428/327 |
| 4,471,037 | 9/1984 | Bannister ............................... 429/191 |
| 4,548,862 | 10/1985 | Hartman ................................. 428/323 |
| 4,606,962 | 8/1986 | Reylek et al. ........................... 428/148 |
| 4,749,612 | 6/1988 | Borkowski et al. ..................... 428/246 |
| 5,162,174 | 11/1992 | Andrei et al. ........................... 429/192 |
| 5,378,405 | 1/1995 | Gutman ................................... 428/355 |

FOREIGN PATENT DOCUMENTS

| | | |
|---|---|---|
| 0256776 | 2/1988 | European Pat. Off. . |
| 0275899 | 7/1988 | European Pat. Off. . |
| 0276691 | 8/1988 | European Pat. Off. . |
| 0422919 | 4/1991 | European Pat. Off. . |
| 0508722 | 10/1992 | European Pat. Off. . |
| 2568574 | 7/1984 | France . |
| 61-272279 | 12/1986 | Japan . |
| 63-012681 | 1/1988 | Japan . |

*Primary Examiner*—James C. Cannon
*Attorney, Agent, or Firm*—Gary L. Griswold; Walter N. Kirn; Darla P. Neaveill

[57] ABSTRACT

A water-resistant, anti-static pressure-sensitive adhesive tape suitable for use as a wafer dicing tape comprising a flexible substrate having opposing surfaces, at least one surface bearing thereon a removable, aziridine-crosslinked microparticulate adhesive comprised of microparticles having a surface bearing thereon an ionic conductive material formed from a polymer electrolyte base polymer, and at least one ionic salt selected from the group consisting of salts of alkali metals and salts of alkaline earth metals, wherein said microparticles have an average diameter of at least about 1 micrometer, said adhesive having an adhesion to steel of from about 0.5 Newtons/100 mm (N/100 mm) to about 10 N/100 mm.

14 Claims, No Drawings

PRESSURE-SENSITIVE ADHESIVE TAPES FOR ELECTRONICS APPLICATIONS

BACKGROUND OF THE INVENTION

This application is a continuation-in-part of U.S. Ser. No. 08/098,166, filed Jul. 28, 1993, now U.S. Pat. No. 5,378,405.

FIELD OF THE INVENTION

The invention relates to antistatic removable microparticulate pressure-sensitive adhesive tapes useful in applications requiring electrical conductivity or elimination of electrostatic charge, especially in large scale robotic printed circuit board and chip plants. These adhesive tapes provide a remarkable capacity for preventing static charge build-up while having low adhesion to allow accurate slicing of wafers and easy removal of individual chips without transfer of adhesive to the chip.

DESCRIPTION OF THE ART

Antistatic adhesive compositions are useful for attaching surface-mount components at points on printed circuit boards where they are to be conductively attached e.g., by soldering. Antistatic adhesives, when coated on selected substrates and suitably converted, provide antistatic, pressure-sensitive adhesive tapes. The tapes are useful for various applications in the electronic industry.

One application for antistatic tapes which is very important to the semiconductor fabrication industry is the attachment of newly manufactured wafers through the die slicing step where the individual chips are sliced with a diamond saw through 60–80% of the wafer thickness, and continued attachment through a testing process to determine if any chips are defective. The good chips then need to be cleanly snapped from the wafer and removed from the tape backing.

A problem with antistatic tapes already available is that either the antistatic properties are not sufficiently strong, i.e., too much charge is present when the chips are removed, causing damage, or the adhesion is not strong enough to hold the chips during processing.

Another problem is that the adhesion of wafer to tape must be low enough to allow the severed chips to be both completely separated from the wafer and removed from the adhesive tape by manual or mechanical means without leaving adhesive residue, but must be strong enough to hold the wafer in place during the sawing process. If the wafer moves, the slicing will not be clean, and damaged chips will again result.

Finally, the chips are usually removed from the tape by bending the portion of tape or applying pressure to the opposite surface of the tape to that surface holding a chip until the chip "pops" from the tape. To be useful, the tape backing must be flexible enough so that it does not split during this process, and the adhesion between the backing and the adhesive must be greater than the adhesion between the adhesive and the chip. Failure of either of these properties will result in portions of adhesive or tape remaining on the chip, which will cause slowdown or stoppage of a manufacturing line while such is remedied, or the chip cannot be properly affixed to an electronic device.

A number of methods are known for preparing antistatic adhesive compositions. One common method is the addition of conductive moieties to conventional adhesive formulations. Antistatic species may be introduced as conductive materials such as electrically conductive metal or carbon particles. Compositions of this type are disclosed in prior art references including E 0276691A, E 0518722A, U.S. Pat. No. 4,606,962, E 0422919A, U.S. Pat. No. 3,104,985, U.S. Pat. No. 4,749,612 and U.S. Pat. No. 4,548,862.

The addition of ionic materials to reduce generation of static charge is also known. Suitable materials of this type include ion conducting species such as those disclosed in Japanese patents JP 61,272,279 and JP 63,012,681.

U.S. Pat. No. 4,098,945 discloses a conductive composition which comprises a polymeric binder system, a plurality of insoluble spherical domains dispersed in the system, and at least one electrically conductive filler dispersed in the binder which provides conductive pathways through the composition. The spherical domains are preferably adhesive microspheres, the use of which lessens the amount of conductive filler used.

Yet another type of antistatic tape material is provided using a metal foil tape backing. One example of this, disclosed in U.S. Pat. No. 3,497,383, provides embossed foil tapes where contact points of metal project from the surface of the adhesive.

No tapes available today provide all of the properties required for good performance; those having low adhesion tend to have less effective antistatic properties because filler is used to reduce the adhesion which tends to change conductivity properties, and those which provide good antistatic properties may have higher adhesion than desirable.

Surprisingly, the present invention provides a removable adhesive tape which holds the wafer in place and yet provides easy removablility for each severed chip, when desired. Further, the tapes of the invention provide exceptional antistatic properties, thus exhibiting significantly lower charges when the chip is removed from the tape than any product currently available.

The unique properties of materials of the present invention are provided by the use of polymeric microparticles having complexes of polymer electrolytes on the surface of each microparticle.

Complexes of polyethylene oxide (PEO) and lithium salts have been shown to be promising materials as solid state polymer electrolytes. The use of these materials in the development of high energy lithium batteries is considered by Gilmour et al in Proc. Electrochemical Society, 89–94, (1989). Lithium salts, like those disclosed in WO 8,303,322, U.S. Pat. No. 4,471,037 and FR 2,568,574, are most commonly used with PEO in polymer electrolytes. Other metal salts such as alkaline earth salts may also enhance electrolytic properties as described in U.S. Pat. No. 5,162,174. Applications for polymer electrolytes have expanded from a focus on energy storage batteries to their use in other areas such as electrochromic displays and addition to molding resins in the production of conductive molded articles.

When coated on suitable substrates and converted into tape format, adhesives of the invention provide antistatic tapes which are extremely effective in dissipating electrostatic charge and have adhesion levels sufficient to hold the chips onto the tape during processing, but not so high as to preclude removal. They also exhibit excellent adhesion between the backing and the adhesive which reduces adhesive transfer to a chip during removal therefrom.

Particulate adhesives are known in the art, and have been coated on a variety of substrates and used primarily in applications requiring a low level of adhesion, e.g., removability. Such spheres and their use in aerosol adhesive systems having repositionable properties are disclosed in U.S. Pat. No. 3,691,140 (Silver). These microparticles are prepared by aqueous suspension polymerization of alkyl acrylate monomers and ionic comonomer, e.g., sodium methacrylate, in the presence of an emulsifier. The use of a water-soluble, substantially oil-insoluble ionic comonomer is critical to preventing coagulation or agglomeration of the microparticles. However, particulate adhesives disclosed in the prior art have all been useful as repositionable adhesives for such applications as Post-It™ brand notes, and other removable items. However, pressure-sensitive tapes made with this type of adhesive have not been considered suitable for use as antistatic tapes due to their ease of removal.

Further, such adhesives have been water-dispersible, and thus have not been able to withstand the water washing step in the wafer dicing operations of robotic printed circuit board manufacture.

However, it has now been discovered that it is possible to provide a surface conductive polymer particle adhesive which possesses sufficient adhesion to adhere during electronic processes, and still retains low tribocharging characteristics.

Surprisingly, the adhesives and tapes of the invention also can withstand water washing without swelling or crazing, while retaining respositionability and low tribocharging characteristics.

SUMMARY OF THE INVENTION

The invention provides a water-resistant, antistatic, removable pressure-sensitive adhesive tape comprising a flexible polymeric film support bearing on at least one major surface thereof a non-tribocharging, microparticulate adhesive formed from conductive, polymeric, inherently tacky, solvent-insoluble, solvent-dispersible, elastomeric microparticles. The tape is especially useful in semiconductor fabrication where low adhesion and flexibility of backing are required, along with resistance to high humidity and water.

Useful removable microparticulate pressure-sensitive adhesive tapes comprise acrylate or modified acrylate particles having a surface comprised of chains of an ionically conducting polymer electrolyte, preferably polyethylene oxide. The microparticles may be solid or hollow, as desired.

More specifically, the invention provides a water-resistant, anti-static pressure-sensitive adhesive tape suitable for use as a wafer dicing tape comprising a flexible substrate having opposing surfaces, at least one surface bearing thereon a removable, aziridine-crosslinked microparticulate adhesive comprised of microparticles having a surface bearing thereon an ionic conductive material formed from a polymer electrolyte base polymer, and at least one ionic salt selected from the group consisting of salts of alkali metals and salts of alkaline earth metals, wherein said microparticles have an average diameter of at least about 1 micrometer, said adhesive having an adhesion to steel of from about 0.5 Newtons/100 mm (N/100 mm) to about 10 N/100 mm.

Preferred pressure-sensitive adhesives useful in tapes of the invention comprise conductive, polymeric, inherently tacky, solvent-insoluble, solvent-dispersible, elastomeric microparticles comprising 100 parts monomers, comprising:

a) from about 70 to about 99 of at least one monomer selected from alkyl (meth) acrylate esters and vinyl esters; and b) up to about 15 parts by weight of at least one polar monomer, c) from about 0.1 part to about 10 parts of a polymer electrolyte, d) from about 0.05 part to about 3.0 parts of at least one ionic salt selected from the group consisting of salts of alkali metals and salts of alkaline earth metals, and e) from about 0.01 to about 2.0 parts of an aziridine crosslinker.

Preferred microparticles use polyethylene oxide as the polymer electrolyte base polymer to form the surface polyelectrolyte complex.

As used herein, these terms have the following meanings.

1. The term "polymer electrolyte" means a polymeric species containing electron donating atoms which may be associated with acceptor atoms.

2. The term "polymer electrolyte base polymer" means a polymer which is capable of forming a polymer electrolyte during formation of the microparticle.

3. The term "polymer electrolyte functional unit" means the group containing the electron donating species.

4. The term "microparticle" means a particle having a diameter of from about 1 micrometer to about 250 micrometers.

5. The term "tribocharging" means electrostatic charge generation associated with friction between separable surfaces.

6. The term "droplet" means the liquid stage of the microparticles prior to the completion of polymerization.

7. The term "cavity" means a space within the walls of a droplet or microparticle when still in the suspension or dispersion medium prior to drying, and thus containing whatever medium was used.

8. The term "void" means an empty space completely within the walls of a polymerized microparticle.

9. The term "hollow" means containing at least one void or cavity.

10. The term "solid" means voids or cavity-free.

11. The term "alkyl (meth) acrylate" means an alkyl acrylate or alkyl methacrylate.

12. The term "modified surface" means a surface which has been subjected to a priming, coating or treatment such as chemical or radiation treatment such that the original properties of the surface have been changed.

13. The term "wafer" means a large disc consisting of many integrated circuits.

14. The term "chip" means an individual integrated circuit.

As used herein, all parts, percents, and ratios are by weight, unless specifically stated otherwise.

DETAILED DESCRIPTION OF THE INVENTION

Tapes of the invention are suitable for use in a variety of applications where transport of electrical current or prevention of electrostatic charge is important. However, tapes of the invention are especially useful in the printed circuit board industry, in an application commonly called "wafer dicing". This process places a wafer on a surface and then slices the wafer into individual integrated circuits or "chips". These chips are then individually useful in electronic components. The chips must be held onto the substrate with sufficient force that they do not loosen and fall to the floor when being moved, either manually, or by a robotic arm. However, the adhesion to the substrate must be sufficiently low that they can be removed when desired, and no adhesive buildup occurs on the lower surface. The removal is typically achieved by bending the substrate and "popping" the chip from it, and the adhesive tape therefor must be flexible enough that the chip can be easily popped from it.

Particulate adhesive compositions can be formulated which show remarkably little susceptibility to tribocharging. In the form of adhesive tapes, these compositions are eminently suitable for use in wafer dicing operations and other similar applications where protection of sensitive electronic components is essential along with ease of removal and integrity of adhesive to tape backing.

Useful microparticulate adhesives have adhesion values to steel of from about 0.5N/100 mm to about 10N/100 mm, preferably from about 1N/100 mm to about 5N/100 mm.

Useful microparticles comprise alkyl acrylate or methacrylate monomers, especially monofunctional unsaturated acrylate or methacrylic esters of non-tertiary alkyl alcohols, the alkyl groups of which have from 4 to about 14 carbon atoms. Such acrylates are oleophilic, water emulsifiable, have limited water solubility, and as homopolymers, generally have glass transition temperatures below about −20° C. Included within this class of monomers are, for example, isooctyl acrylate, 4-methyl-2-pentyl acrylate, 2-methylbutyl acrylate, isoamyl acrylate, sec-butyl acrylate, n-butyl acrylate, 2-ethylhexyl acrylate, isodecyl methacrylate, isononyl acrylate, isodecyl acrylate, and the like, singly or in mixtures.

Preferred acrylates include isooctyl acrylate, isononyl acrylate, isoamyl acrylate, isodecyl acrylate, 2-ethylhexyl acrylate, n-butyl acrylate, sec-butyl acrylate, and mixtures thereof. Acrylate or methacrylate or other vinyl monomers which, as homopolymers, have glass transition temperatures higher than about −20° C., e.g., tert-butyl acrylate, vinyl acetate, and the like, may be utilized in conjunction with one or more of the acrylate or methacrylate monomers provided that the glass transition temperature of the resultant polymer is below about −20° C.

Useful vinyl ester monomers are those which form homopolymers having glass transition temperatures below about 10° C. Such esters comprise 1 to 14 carbon atoms, and includes such monomers as vinyl 2-ethylhexanoate, vinyl caprate, vinyl laurate, vinyl pelargonate, vinyl hexanoate, vinyl propionate, vinyl decanoate, vinyl octanoate, and the like.

Useful polar monomers include moderately polar monomers such as N-vinyl-2-pyrrolidone, N-vinyl caprolactam, acrylonitrile, vinyl acrylate, and diallyl phthalate, as well as strongly polar monomers such as acrylic acid, methacrylic acid, itaconic acid, hydroxyalkyl acrylates, cyanoalkyl acrylates, acrylamides, substituted acrylamides. When more than one polar monomer is used, mixtures may include monomers having similar or unlike polarities, e.g., one moderately polar and one strongly polar monomer or two monomers from one group.

The conductive microparticles and the pressure-sensitive adhesives made therefrom comprise at least about 70 parts by weight of at least one alkyl (meth)acrylate ester or vinyl ester and correspondingly, up to about 30 parts by weight of one or more polar monomers.

Polymer electrolyte base polymers suitable for use in the invention include polyethylene oxide, polyphenylene oxide, polyphenylene sulfide, polyethylene sulfide, polyethyleneimine, polypropylene oxide, polybutylene oxide, polybutylene sulfide, polybutylene imine, and the like. Polyethylene oxide is preferred. Useful amounts of the polymer electrolyte base polymer in microparticles of the invention range from about 0.1 part to about 10 parts, preferably from about 1 part to about 5 parts, based on 100 parts monomer weight.

The conductive properties of the polymeric microparticles are further enhanced by the addition of ionic salts to adhesive compositions which contain the microparticles. It is believed that the ionic salts become associated with the electron donating groups present in the amorphous polymer domains. The adhesive contains from about 0.01 moles to about 10 moles of at least one salt of an alkali metal or alkaline earth metal per mole of polymer electrolyte base unit, or from about 0.05 part to about 3.0 parts per 100 parts monomer.

Salts used for this purpose include salts of alkali metals, and alkaline earth metals, including but not limited to, NaI, NaSCN, $BaCF_3So_3$, NaBr, $NaClO_4$, LiCl, $LiNO_3$, $LiCF_3SO_3$, $LiSO_4$, $LiN(SO_2CF_3)_2$, LiOH and KOH. Lithium salts are preferred for the present invention, especially lithium nitrate.

In order to exhibit the necessary water-resistance, the composition also contains an aziridine crosslinking agent. Useful aziridines include pentaerythritol-tris-($\beta$-(N-aziridinyl)propionate), and trimethylolpropane-tris-($\beta$-(N-aziridinyl)propionate), both available as 10% solutions in iPrOH under the trade name "XAMA", i.e., XAMA-2 and XAMA-7, from B. F. Goodrich, Specialty Chemicals, and trimethylolpropane-tris-($\beta$-(N-methylaziridinyl)propionate), available as "CX-100" from Zeneca Resins, and mixtures of one or more of the above. Surprisingly, the use of such aziridines provides the water-resistance necessary while maintaining the required balance of adhesion and removability. The aziridines are present in an amount of from about 0.01 part to about 2 parts per 100 parts monomer.

Further crosslinking agents may also be included, such as a multifunctional (meth) acrylate, e.g., butanediol diacrylate or hexanediol diacrylate, or other multifunctional crosslinker such as divinylbenzene. When used, the crosslinker(s) is(are) added at a level of up to about 1 percent, preferably up to about 0.5 percent, of the total polymerizable composition.

Tapes of the present invention display dramatically different tribocharging properties than continuous adhesive layers of similar chemical components. For example, when coated on a film substrate, an acrylate-based emulsion adhesive produces a continuous film with a planar surface. Upon application and removal from a planar surface, this adhesive tape will cause generation of charged species on the surface of the adhesive and on the planar surface to which it was attached. The residual charge has a magnitude of up to several thousand volts. However, adhesive tape samples of the current invention, under similar conditions generate almost no charge upon removal from the planar surface.

Without wishing to be bound by theory, it is believed that the improved electrical properties of the adhesive are due to two aspects of its particulate nature; firstly, the particulate prevents full area contact of the adhesive layer with the planar surface. The reduced area of attachment results in a reduction of area of separation when the tape is removed from the planar surface, and thus there is less tendency for charged species to be generated. Secondly, there is a surface layer of conductive species available on each microparticle. The surface layer is provided by materials which facilitate conduction of electrical charge. Provision of the host polymer in spherical form allows increased availability of electron donating polymer chains.

Also, it is possible to exert better control over the length of the chains so as to increase the relative number of amorphous domains. This provides a larger network of conductive sites which allows more efficient conduction of electric current.

Electrical characteristics of pressure-sensitive adhesives of the invention vary from somewhat resistive to significantly conductive materials.

The microparticulate adhesives and an emulsion containing the microparticles may be prepared by various emulsification processes, which are varied depending on whether hollow or solid microparticles are desired. Aqueous suspensions of hollow microparticles may be prepared by a "two-step" emulsification process which first involves forming a water-in-oil emulsion of an aqueous solution of polar monomer(s) in oil phase monomer, i.e., at least one (meth)acrylate or vinyl ester monomer, with a polymer electrolyte base polymer, using an emulsifier having a low hydrophilic-lipophilic balance (HLB) value. Suitable emulsifiers are those having an HLB value below about 7, preferably in the range of about 2 to about 7. Examples of such emulsifiers include sorbitan monooleate, sorbitan trioleate, and ethoxylated oleyl alcohol such as Brij™ 93, available from Atlas Chemical Industries, Inc.

Thus, in this first step, oil phase monomer(s), polymer electrolyte base polymer, emulsifier, a free radical initiator, and a crosslinking monomer or monomers are combined, and an aqueous solution of all or a portion of the polar monomer(s) is agitated and poured into the oil phase mixture to form a water-in-oil emulsion. The polymer electrolyte base polymer may be added to either the oil phase or the water phase. A thickening agent, e.g., methyl cellulose may also be included in the aqueous phase of the water-in-oil emulsion. In the second step, a water-in-oil-in water emulsion is formed by dispersing the water-in-oil emulsion of the first step into an aqueous phase containing an emulsifier having an HLB value above about 6. The aqueous phase may also contain any portion of the polar monomer(s) which was not added in step one. Examples of such emulsifiers include ethoxylated sorbitan monooleate, ethoxylated lauryl alcohol, and alkyl sulfates. In both steps, when an emulsifier is utilized, its concentration should be greater than its critical micelle concentration, which is herein defined as the minimum concentration of emulsifier necessary for the formation of micelles, i.e., submicroscopic aggregations of emulsifier molecules. Critical micelle concentration is slightly different for each emulsifier, usable concentrations ranging from about $1.0 \times 10^{-4}$ to about 3.0 moles/liter. Additional detail concerning the preparation of water-in-oil-in-water emulsions, i.e., multiple emulsions, may be found in various literature references, e.g., *Surfactant Systems: Their Chemistry, Pharmacy, & Biology*, (D. Attwood and A. T. Florence, Chapman & Hall Limited, New York, N.Y., 1983).

The final process step of this method involves the application of heat or radiation to initiate polymerization of the monomers. Useful initiators are those which are normally suitable for free radical polymerization of acrylate or vinyl ester monomers and which are oil-soluble and of very low solubility in water. However, when the polar monomer is N-vinyl pyrrolidone, the use of benzoyl peroxide as the initiator is recommended.

Examples of such initiators include azo compounds, hydroperoxides, peroxides, and the like, and photoinitiators such as benzophenone, benzoin ethyl ether, and 2,2-dimethoxy-2-phenyl acetophenone.

Use of a water-soluble polymerization initiator causes formation of substantial amounts of latex. The extremely small particle size of latex particles renders any significant formation of latex undesirable. The initiator is generally used in an amount ranging from about 0.01 percent up to about 10 percent by weight of the total polymerizable composition, preferably up to about 5 percent.

Aqueous suspensions of hollow conductive microparticles may also by prepared by a "one-step" emulsification process comprising aqueous suspension polymerization of at least one alkyl (meth)acrylate ester monomer or vinyl ester monomer and at least one polar monomer and a polymer electrolyte base polymer in the presence of at least one emulsifier capable of producing a water-in-oil emulsion inside the droplets which is substantially stable during emulsification and polymerization. As in the two-step emulsification process, the emulsifier is utilized in concentrations greater than its critical micelle concentration. In general, high HLB emulsifiers are required, i.e., emulsifiers having an HLB value of at least about 25, will produce stable cavity-containing droplets during the polymerization, and are suitable for use in this one-step process. Examples of such emulsifiers include alkylarylether sulfates such as sodium alkylarylether sulfate, e.g., Triton™ W/30, available from Rohm and Haas, alkylarylpolyether sulfates such as alkylarylpoly(ethylene oxide) sulfates, preferably those having up to about 4 ethyleneoxy repeat units, and alkyl sulfates such as sodium lauryl sulfate, ammonium lauryl sulfate, triethanolamine lauryl sulfate, and sodium hexadecyl sulfate, alkyl ether sulfates such as ammonium lauryl ether sulfate, and alkylpolyether sulfates such as alkyl poly(ethylene oxide) sulfates, preferably those having up to about 4 ethyleneoxy units. Alkyl sulfates, alkyl ether sulfates, alkylarylether sulfates and mixtures thereof are preferred as they provide a maximum void volume per microparticle for a minimum amount of surfactant. Nonionic emulsifiers, e.g., Siponic™ Y-500-70 (ethoxylated oleyl alcohol), commercially available from Alcolac, Inc, and Pluronic™ P103 (a block copolymer of polypropylene oxide and polyethylene oxide commercially from BASF Corporation) can be utilized alone or in conjunction with anionic emulsifiers. Polymeric stabilizers may also be present but are not necessary.

Solid microparticles useful in adhesive tapes of the invention may be made by a similar one-step process comprising aqueous suspension polymerization of at least one alkyl (meth)acrylate ester monomer or vinyl ester monomer, at least one polar monomer and a polymer electrolyte base polymer in the presence of a suspension stabilizer. It is not necessary to use a high HLB emulsifier because the droplets formed need not be cavity-containing droplets. Examples of such useful lower HLB emulsifiers include ammonium lauryl sulfate such as Standapol™ A, available from Hercules and other steric or electrosteric polymeric stabilizers such as (poly)vinyl alcohol, polyacrylic acid, polymethacrylic acid, polyacrylamide, polyvinyl pyrrolidone, polyvinyl methylether, and the like.

Preparation of microspheres may be modified by withholding the addition of all or part of the polymer electrolyte base polymer, and polar monomers until after polymerization of the oil phase is initiated; however, the components must be added to the polymerizing mixture prior to 100% polymer conversion.

Discrete conductive polymeric microparticles may also be prepared via suspension polymerizations disclosed in U.S. Pat. Nos. 3,691,140, 4,166,152, 4,636,432, 4,656,218, and 5,045,569, for preparing adhesive compositions.

The conductive microparticles are normally tacky, elastomeric, insoluble but swellable in organic solvents, and small, typically having diameters of at least about 1 micrometer, preferably in the range of about 1 to about 250 micrometers, more preferably from about 1 to about 50 micrometers. They may be solid or contain a single void, or multiple voids.

Following polymerization, an aqueous suspension of the microparticles is obtained which is stable to agglomeration or coagulation under room temperature conditions. The suspension may have non-volatile solids contents of from about 10 to about 50 percent by weight. Upon prolonged standing, the suspension separates into two phases, one phase being aqueous and substantially free of polymer, the other phase being an aqueous suspension of conductive microparticles. Where high HLB emulsifiers are used the droplets have one or more cavities which, upon drying, become voids. Both phases may contain a minor portion of small latex particles. Decantation of the microparticle-rich phase provides an aqueous suspension having a non-volatile solids content on the order of about 40–50 percent which, if shaken with water, will readily redisperse.

If desired, the aqueous suspension of conductive microparticles may be utilized immediately following polymerization to provide inherently tacky pressure-sensitive adhesive coatings having low tribocharging characteristics, or "antistatic" adhesives.

Tapes of the invention especially useful in wafer dicing operations may be produced by coating microparticle containing compositions of the invention onto a flexible substrate which will allow sufficient flex to "pop" a chip without causing delamination of the adhesive or tearing of the backing. Suitable substrates include polymeric films such as (poly)vinylidiene chloride, polyesters, polyethylene terephthalate, polyphenylene sulfide, polypropylene, polyethylene, polyetherimide, and polyethersulfone.

The coating may be carried out by conventional methods such as knife coating, Meyer bar coating, knurled roll, and other conventional means known in the art for coating adhesives such as use of an extrusion die.

Primer or binders may be used, but they are not required. Preferred embodiments comprise a binder to ensure that the adhesion between the backing and the adhesive exceeds the adhesion between the adhesive and the electronic component to which it will be attached. Useful primers include phenolic resins, acrylic resins, rubbery components, block copolyers, and mixtures thereof.

Where high-temperature properties are required, a useful primer will comprise at least one phenolic resin and at least one rubbery component. Useful rubbery components include natural rubbers such as butyl rubbers, and various synthetic compounds, including but not limited to, acrylonitrile-butadiene, acrylonitrile-butadiene-styrene copolymers, styrene-butadiene-styrene, styrene-ethylene butylene-styrene, polychloroprene, polybutadiene, polyisoprene, styrene-isoprene-styrene, and mixtures thereof. Preferred primers contain mixtures of two or more rubbery compounds, such as acrylonitrile-butadiene, and polychloroprene.

Useful phenolic resins, include but are not limited to, phenol formaldehyde resin, available commercially from Union Carbide under the trade names UCAR BKR-2620, and UCAR CK-1635, novolak resins and the like, and mixtures thereof. Preferred primers contain from about 40 to about 120, preferably from about 40 to about 100 parts of phenolic resin per 100 parts of rubbery compound.

When used, a primer may further comprise additives such as tackifying agents, antioxidants, colorants, viscosity adjusting agents, solvents and other conventional additives, which may be used in such amounts as are known in the art.

The tape may be commercialized in roll form, or may be divided into segments for sale, such as strips or labels. Additionally, the adhesive may be provided between two substrates, e.g., the adhesive is coated onto a paper substrate, which can be used as a label, which may be provided on a low adhesion backsize or other easily removable surface for individual use.

The adhesion properties of the adhesives may be altered by addition of tackifying resin and/or plasticizer. Preferred tackifiers for use herein include hydrogenated rosin esters commercially available from companies such as Hercules Inc., under such trade names as Foral™ 65, Foral™ 85, and Foral™ 105. Other useful tackifiers include those based on t-butyl styrene. Useful plasticizers include dioctyl phthalate, 2-ethyl hexyl phosphate, tricresyl phosphate, and the like.

It is also within the scope of this invention to include various other components to tapes of the invention, such as pigments, fillers, including additional conductive fillers, stabilizers, or various polymeric additives.

These and other aspects of the invention are illustrated by the following examples which should not be viewed as limiting in scope.

Test Methods

Resistivity Measurements of Antistatic Coatings

Resistivity is a measure of the intrinsic ability of a material to conduct electrons. It is a property which is independent of the dimensions of the material sample.

The surface resistivity of coatings of the invention was measured by connecting a Keithley 616 digital electrometer (Keithley 6105 resistivity adapter) to a 500 volt power supply, and attaching to an electrometer. Individual samples were measured using standard procedures according to ASTM D-257.

Peel Adhesion

Peel adhesion is the force required to remove a coated flexible sheet material from a test panel measured at a specific angle and rate of removal. In the examples, this force is expressed in grams per centimeter (cm) width of coated sheet. The procedure followed is:

A strip 1.27 cm in width of the coated sheet is applied to the horizontal surface of a clean glass test plate with at least 12.7 lineal cm in firm contact. A 2 kg hard rubber roller is used to apply the strip. The free end of the coated strip is doubled back nearly touching itself so the angle of removal will be 180°. The free end is attached to the adhesion tester scale. The steel test plate is clamped in the jaws of a tensile testing machine which is capable of moving the plate away from the scale at a constant rate of 2.3 meters per minute. The scale reading in grams is recorded as the tape is peeled from the steel surface. The data is reported as the average of the range of numbers observed during the test.

Wafer Dicing Tape Performance

A useful wafer dicing tape will survive a series of processing steps during which individual integrated circuit chips are separated from the main wafer. The steps include wafer mounting, sawing, washing, drying and die picking.

Wafer Mounting

This process combines the steps of attaching an integrated circuit wafer to the adhesive tape, attaching the tape to a circular support frame and trimming excess tape from around the outer circumference of the support frame.

Wafer Sawing

A wafer sawing unit contains a computer-controlled diamond saw that scores the wafer along lines to define individual chips or dies. Water jets provide cooling and cleaning during the cutting operation, requiring the adhesive to resist water attack and retain a firm grip on the wafer.

Wafer Washing

Following transfer from the wafer sawing unit to the wafer washing station, high power jets of water wash over the wafer and its associated support structure. This cleans the wafer by removing residual saw-dust. Thereafter the washed assembly is dried before die picking.

Die Picking

Computer controlled equipment directs force behind a selected chip formed in the wafer. The force causes the wafer to crack around the chip or die and releases the chip from the main body of the wafer sufficiently to be cleanly picked from the wafer and released by the wafer dicing tape.

| | Key to Abbreviations |
|---|---|
| IOA | Isooctyl Acrylate |
| iPrOH | Isopropyl Alcohol |
| AA | Acrylic Acid |
| PEO | Polyethylene Oxide Acrylate |
| PEO (750) | Acrylate terminated PEO having a 750 MW |
| BPER | 70% Benzoyl Peroxide, Lucidol ™ 70 |
| PEODMA | Polyethylene Oxide Dimethacrylate [(PEO)$_9$DMA] |
| 1,6 HDDA | 1,6 Hexanediol Diacrylate |
| ALS | Ammonium Lauryl Sulfate, |
| Standapol ™ A | Ammonium Lauryl Sulfate from Hercules |

Key to Materials

Lithium Nitrate is provided as a 20% solution in distilled water.

Benzotriazole, anti-corrosion agent, is provided as a 10% solution in 50/50 iPrOH/Water XAMA - 7—Pentaerythritol-tris-(β-(N-aziridinyl)propionate) crosslinker as a 10% solution in iPrOH XAMA-2—Trimethylolpropane-tris-(β-(N-aziridinyl)propionate) crosslinker as a 10% solution in iPrOH. Both crosslinkers are available from B.F. Goodrich, Specialty Chemicals, Performance Resins and Emulsions Division.

CX-100—Trimethylolpropane-tris-(β-(N-aziridinyl)propionate) provided as a 10% solution in iPrOH, available from Zeneca Resins.

Key to Film Substrates

Blue PVC film from Ross & Roberts

Scotchcal™ Film (Plasticized PVC) from 3M Company

Clear PVC film from American Mirrex

Biaxially Oriented Polypropylene (BOPP) film

Phenolic Resin BKR-2620-Phenol-Formaldehyde Resin, designated BKR-2620 UCAR, by Union Carbide.

SantivarA-Antioxidant di-tertiary amyl hydroquinone.

Piccolyte S115-Polyterpene resin (tackifier)

Zirex-Zinc Resinate (tackifier)

Phenolic Resin (CK-1635)-Phenol-Formaldehyde Resin, by Union Carbide, designated CK-1635 UCAR.

EXAMPLES

PREPARATIONS OF MICROPARTICLES

Example 1

Acrylic acid (5.4 g), polyethylene oxide acrylate (PEO 750) (13.5 g), PEODMA (0.15 g) and 70% benzoyl peroxide (0.99 g) were dissolved in isooctyl acrylate (223.2 g). This solution was added to an aqueous solution of surfactant. The surfactant solution comprised Standapol™A, available from Hercules, (8.4 g) dissolved in de-ionized water (360 g) in a glass-lined vessel. An emulsion of the isooctyl acrylate solution in the aqueous solution was produced by high shear mixing using an Omni mixer at setting 5. Mixing was continued until the average particle size of the oily droplets was approximately 3 μm. Size was determined using an optical microscope.

The resulting oil-in-water emulsion was charged to a 1-liter glass resin reactor equipped with four baffles, a paddle stirrer and a suitable heat source, such as a heating mantle. With continuous stirring at a rate of 400 rpm, the reactor and contents were heated to 60° C.

At this point the reactor was degassed with nitrogen. A reaction proceeded in the absence of oxygen. This was allowed to continue for a period of 22 hours while both temperature and stirring rate were maintained. The resulting aqueous suspension contained insoluble particles of approximately 5 μm in diameter.

To 100 parts of this particulate adhesive, was added a combination of lithium salts to increase ionic conductivity, ammonium hydroxide for pH adjustment, benzotriazole for corrosion inhibition and a crosslinker to improve water resistance of the coating. Each of the additional ingredients was slowly stirred into the adhesive composition and thoroughly mixed just prior to coating. Use of the coating composition within one hour of crosslinker addition provided optimum coating results.

TABLE 1

Adhesive Compositions

| Composition | Sample 1 | Sample 2 | Sample 3 |
|---|---|---|---|
| Adhesive | 100 g | 100 g | 100 g |
| 20% LiNO$_3$ | 2.5 g | 2.5 g | 2.5 g |
| 10% benzo triazole | 0.5 g | 0.5 g | 0.5 g |
| 10% CX-100 | 0.06 g | | |
| 10% XAMA-2 | — | 0.06 g | — |
| 10% XAMA-7 | — | — | 0.03 g |
| Water | — | 50 g | 102 g |

| | Sample 4 | Sample 5 | Sample 6 | Sample 7 |
|---|---|---|---|---|
| Adhesive | 100 g | 100 g | 100 g | 100 g |
| 20% LiNO$_3$ | 2.5 g | 2.5 g | 2.5 g | 2.5 g |
| 10% benzo triazole | 0.5 g | 0.5 g | 0.5 g | 0.5 g |
| 10% XAMA-7 | 0.06 g | 0.06 g | 0.06 g | 0.06 g |
| NH$_4$OH | — | 0.3 g | 0.44 g | 0.50 g |
| Water | 50 g | 50 g | 50 g | 50 g |
| pH | 2.7 | 7.2 | 8.0 | 8.9 |

Samples 4 and 5 showed good water resistance. Preferred compositions have a pH from about 2.5 to about 7.0; most preferred compositions from about 3.0 to about 7.0. At higher pHs such as 8 or more, poor resistance to water was seen (Samples 6 and 7).

Preparation of Primer Solution

| Materials | | |
|---|---|---|
| Butadiene/Acrylonitrile | 75.00 parts | 5.755% |
| Neoprene W. | 25.00 parts | 1.918% |
| Phenolic Resin BKR-2620 | 19.90 parts | 1.527% |
| Santivar A | 3.95 parts | 0.303% |
| Piccolyte S115 | 49.67 parts | 3.811% |
| Zirex | 49.67 parts | 3.811% |
| Phenolic Resin | 69.43 parts | 5.328% |
| Methyl Ethyl Ketone | 329.57 parts | 25.290% |
| iso-Propanol | 60.00 parts | 4.604% |
| Toluene | 621.00 parts | 47.652% |

The resins, tackifiers and antioxidant indicated above are dissolved in a mixed solvent comprising methyl ethyl ketone, iso-propanol and toluene to provide a primer coating for film supports. Conventional churns, equipped with stirrers, or similar equipment may be used for primer solution preparation. The solution is inspected for clarity and filtered if necessary.

Film Priming

One part of the primer composition was diluted, prior to coating, with two parts of a mixed solvent of 2:1 toluene:MEK. Both the PVC and Scotchcal™ films received a coat of primer using a #4 Meyersbar. Evaporation of the primer solvent at 77° C., for about 3 minutes, yielded a dried primed film suitable for coating with adhesive. The dried primer layer was approximately $7.9 \times 10^{-6}$ mm to $1.2 \times 10^{-5}$ mm thick. The primer was direct coated onto both films.

(An alternative means of primer application uses a gravure roll coater equipped with a knurled roll of about 10 lines/mm with drying at 75° C.)

Adhesive Coating

Two methods, for applying the adhesive to the primed backing, gave suitable product for application as wafer dicing tapes. The ScotchCal™ was directly coated with adhesive, i.e., the adhesive applied directly to the primed substrate using a #12 Meyer bar then dried at 66° C. for 6 minutes. The PVC was coated by a transfer method, i.e., a knurled-roll coating was used to prepare an adhesive layer, $1.2 \times 10^{-4}$ mm thick, on a release liner. Thereafter transfer of the adhesive layer to the primed surface of the film produced the adhesive tape of the present invention.

An alternative means of adhesive application uses a gravure roll coater having a knurled roll of about 3.5 lines/mm.

Table 2

Adhesive Tape Properties

The following table demonstrates the properties of wafer dicing tape of the invention as well as two comparative tape constructions. The first comparative tape, called C1, is a commercially available antistatic tape, available from Nitto Corporation. The second comparative, called C2 is a non-water resistant adhesive similar to those of the invention, but having a pH of 9.2.

| Sample | Volts Tribocharge | | Resistance | Adhesion | Water |
| | On Steel | On Silicon | Ohms | oz/inch | Resistance |
|---|---|---|---|---|---|
| C1 Nitto Tape | 1840 | 1183 | $5.2 \times 10^{10}$ | 2.8 | Good |
| Sample 3 on Blue PVC | 6 | 2 | $8.5 \times 10^{7}$ | 3.0 | Good |
| Sample 3 on Scotchcal | 13 | 1 | $4.0 \times 10^{7}$ | 3.5 | Good |
| C2 on Blue PVC | 6 | 2 | $5.2 \times 10^{7}$ | 2.5 | Swells |

What is claimed is:

1. A water-resistant, anti-static pressure-sensitive adhesive tape suitable for use as a wafer dicing tape comprising a flexible substrate having opposing surfaces, at least one surface bearing thereon a removable, aziridine-crosslinked microparticulate adhesive comprised of microparticles having a surface bearing thereon an ionic conductive material formed from a polymer electrolyte base polymer, and at least one ionic salt selected from the group consisting of salts of alkali metals and salts of alkaline earth metals, wherein said microparticles have an average diameter of at least about 1 micrometer, said adhesive having an adhesion to steel of from about 0.5Newtons/100 mm (N/100 mm) to about 10 N/100 mm.

2. A water-resistant anti-static particulate pressure-sensitive adhesive according to claim 1, said adhesive having an adhesion of from about 0.5N/100 mm to about 10N/100 mm.

3. A water-resistant anti-static particulate pressure-sensitive adhesive according to claim 1, comprising an aziridine crosslinking agent selected from the group consisting of pentaerythritol-tris-(β-(N-aziridinyl)propionate), trimethylolpropane-tris-(β-(N-aziridinyl)propionate), trimethylolpropane-tris-(β-(N-methylaziridinyl)propionate) and mixtures thereof.

4. An anti-static pressure-sensitive adhesive tape according to claim 1 wherein said microparticulate adhesive comprises a polymer of monomers comprising:
  a) at least about 70 parts of at least one alkyl (meth)acrylate or vinyl ester,
  b) correspondingly, up to about 30 parts of at least one polar monomer, to make 100 parts monomer, and wherein said ionic conductive material comprises a polymer electrolyte formed from a polymer electrolyte base polymer, said polymer electrolyte base polymer added in an amount of from about 0.1 part to about 10 parts, and from about 0.01 moles to about 10 moles of at least one salt of an alkali metal or alkaline earth metal per mole of polymer electrolyte base unit.

5. An anti-static pressure-sensitive adhesive tape according to claim 1 wherein said ionic conductive material is formed from a polymer electrolyte base polymer selected from the group consisting of polyethylene oxide, polyphenylene oxide, polyphenylene sulfide, polyethylene sulfide, polyethyleneimine, polypropylene oxide, polybutylene oxide, polybutylene sulfide, and polybutylene imine.

6. An anti-static particulate pressure-sensitive adhesive according to claim 5 wherein the polymer electrolyte base polymer is polyethylene oxide.

7. A anti-static pressure-sensitive adhesive tape according to claim 4 wherein said ionic salt is selected from the group consisting of LiCl, $LiNO_3$, $LiCF_3SO_3$, $LiSO_4$, LiOH, KOH, NaSCN, NaI, $BaSO_3CF_3$, $LiN(SO_3CF_3)_2$ and $NH_4OH$.

8. An anti-static pressure-sensitive adhesive tape according to claim 4 wherein said monomer comprises:

a) at least about 85 parts by weight of at least one alkyl (meth)acrylate or vinyl ester, and b) correspondingly, up to about 15 parts by weight of at least one polar monomer, to make 100 parts monomer, wherein said ionic conductive material comprises a polymer electrolyte material formed from about 0.1 part to about 10 parts of a polymer electrolyte base polymer, and from about 0.01 moles to about 10 moles of at least one salt of an alkali metal or alkaline earth metal per mole of polymer electrolyte base unit.

9. An anti-static pressure sensitive adhesive tape according to claim 8 wherein the alkyl (meth)acrylate is selected from the group consisting of isooctyl (meth)acrylate, 2-ethylhexyl (meth)acrylate, isononyl (meth)acrylate, isoamyl (meth)acrylate, isodecyl (meth)acrylate, and butyl (meth)acrylate.

10. An anti-static pressure-sensitive adhesive tape of claim 9 wherein the vinyl ester is selected from the group consisting of vinyl 2-ethylhexanoate, vinyl caproate, vinyl laurate, vinyl pelargonate, vinyl hexanoate, vinyl propionate, vinyl decanoate, and vinyl octanoate.

11. An anti-static pressure-sensitive adhesive tape according to claim 10 wherein said polar monomer is selected from the group consisting of N-vinyl-2-pyrrolidone, N-vinyl caprolactam, acrylonitrile, vinyl acrylate, diallyl phthalate, acrylic acid, methacrylic acid, itaconic acid, hydroxyalkyl acrylates, cyanoalkyl acrylates, acrylamides, and substituted acrylamides.

12. An anti-static pressure-sensitive adhesive tape according to claim 1 wherein said flexible substrate is selected from the group consisting of (poly)vinylidiene chloride, polyesters, polyethylene terephthalate, polyphenylene sulfide, polypropylene, polyethylene, polyetherimide, and polyethersulfone.

13. An anti-static pressure-sensitive adhesive tape according to claim 12 wherein said substrate is vinyl.

14. An antistatic pressure-sensitive adhesive tape according to claim 1 wherein said tape has a surface which will accept printing.

* * * * *